(12) United States Patent
Huang et al.

(10) Patent No.: US 8,581,256 B2
(45) Date of Patent: Nov. 12, 2013

(54) PIXEL STRUCTURE AND FABRICATION METHOD OF PIXEL STRUCTURE

(75) Inventors: Chang-Yu Huang, Taipei (TW); Pei-Ming Chen, New Taipei (TW)

(73) Assignee: Au Optronics Corporation, Hsinchu (TW)

( * ) Notice: Subject to any disclaimer, the term of this patent is extended or adjusted under 35 U.S.C. 154(b) by 26 days.

(21) Appl. No.: 13/430,677

(22) Filed: Mar. 26, 2012

(65) Prior Publication Data

US 2013/0119386 A1 May 16, 2013

(30) Foreign Application Priority Data

Nov. 15, 2011 (TW) .............................. 100141606 A

(51) Int. Cl.
*H01L 29/10* (2006.01)
*H01L 29/04* (2006.01)
*H01L 31/00* (2006.01)

(52) U.S. Cl.
USPC ........................................................ 257/59

(58) Field of Classification Search
USPC ......... 257/59, 71, 72, 83, 257, 290, 351, 368, 257/392, 299.01–299.7, 40, 642–643, 759, 257/E51.001, E51.052, E25.008–E25.009; 438/29, 69, 82, 99
See application file for complete search history.

(56) References Cited

U.S. PATENT DOCUMENTS

| 8,476,633 B2 * | 7/2013 | Yoo et al. .......................... 257/59 |
| 2007/0222936 A1 * | 9/2007 | Shih ................................ 349/187 |
| 2010/0144071 A1 * | 6/2010 | Lin et al. ........................... 438/23 |
| 2010/0224878 A1 | 9/2010 | Kimura |
| 2010/0315569 A1 | 12/2010 | Lin et al. |

FOREIGN PATENT DOCUMENTS

| CN | 101826521 | 9/2010 |
| TW | 200821721 | 5/2008 |

OTHER PUBLICATIONS

Jung et al., "A New AMOLED Pixel Compensating the Combination of n-Type TFT and Normal OLED Device," SID 09 Digest 40 (1), Jun. 2009, pp. 1-4.
"First Office Action of China counterpart application" issued on Jul. 3, 2013, p1-p5.

* cited by examiner

*Primary Examiner* — Dao H Nguyen
*Assistant Examiner* — Tram H Nguyen
(74) *Attorney, Agent, or Firm* — Jianq Chyun IP Office

(57) ABSTRACT

A pixel structure and its fabrication method are provided. The pixel structure includes a channel layer, a first patterned metal layer, a first insulation layer, a second patterned metal layer, a second insulation layer, and a pixel electrode. The first patterned metal layer includes a data line, a source, and a drain. The first insulation layer has a first opening exposing the drain. The second patterned metal layer includes a scan line and a capacitor electrode. The capacitor electrode has at least one first portion overlapping the data line. The second insulation layer has a second opening communicating with the first opening to expose the drain. The pixel electrode is connected to the drain through the first opening and the second opening and at least overlaps the first portion of the capacitor electrode.

15 Claims, 5 Drawing Sheets

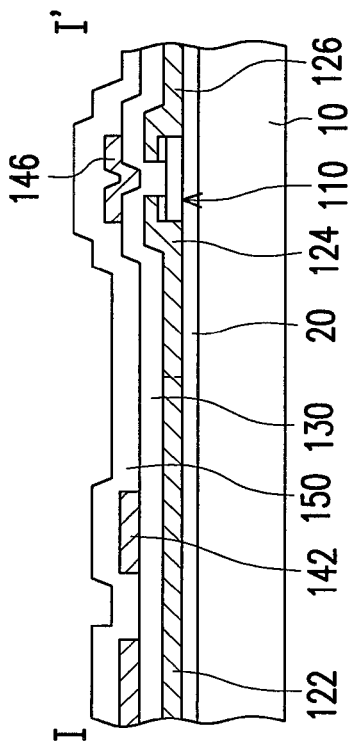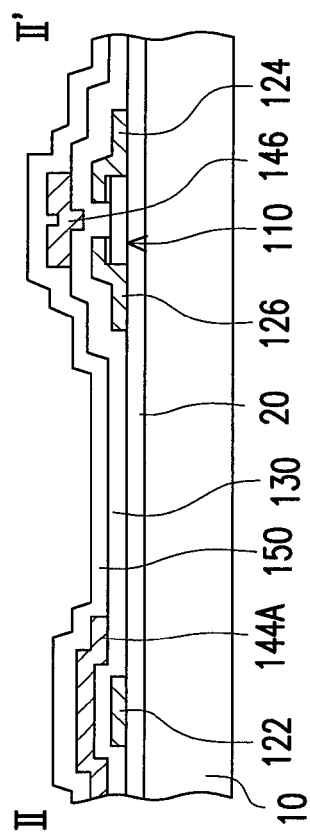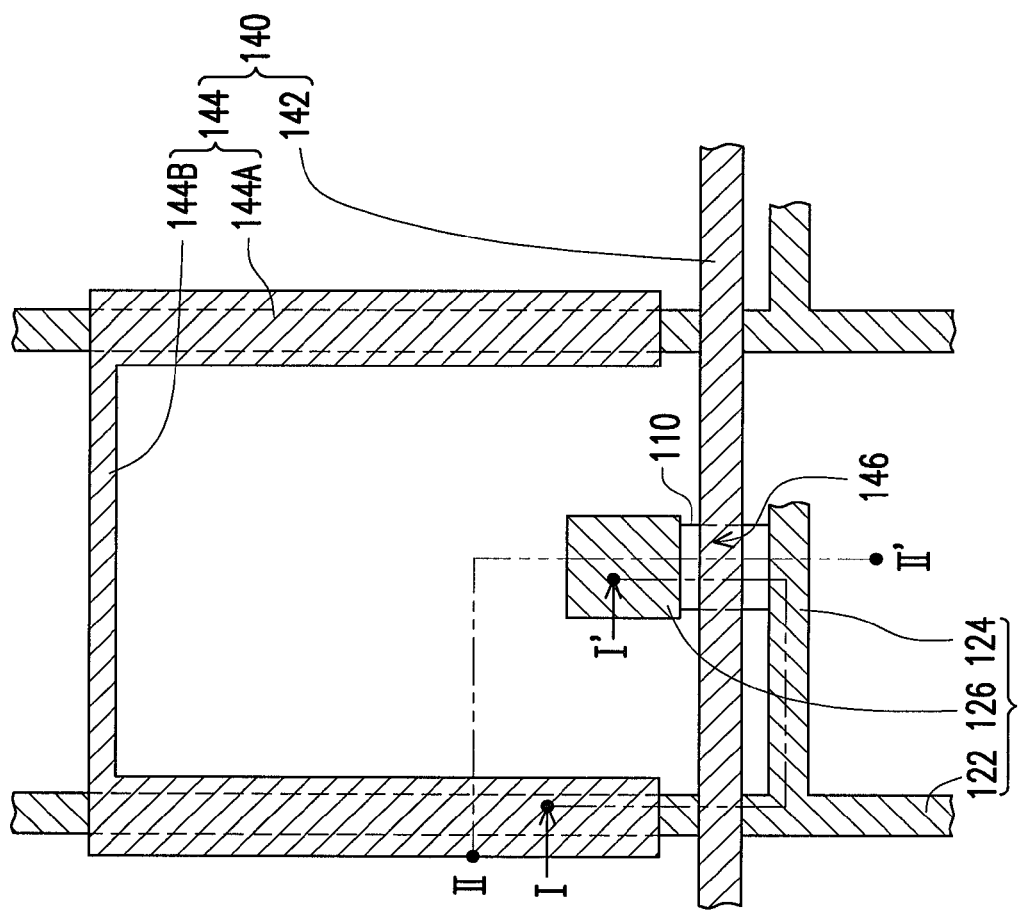

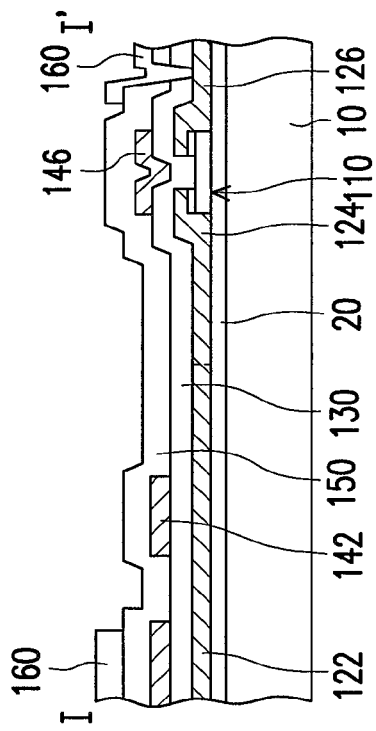
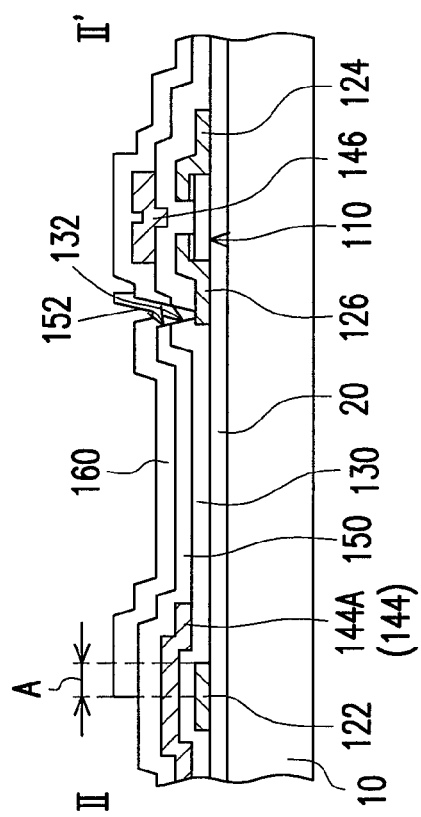
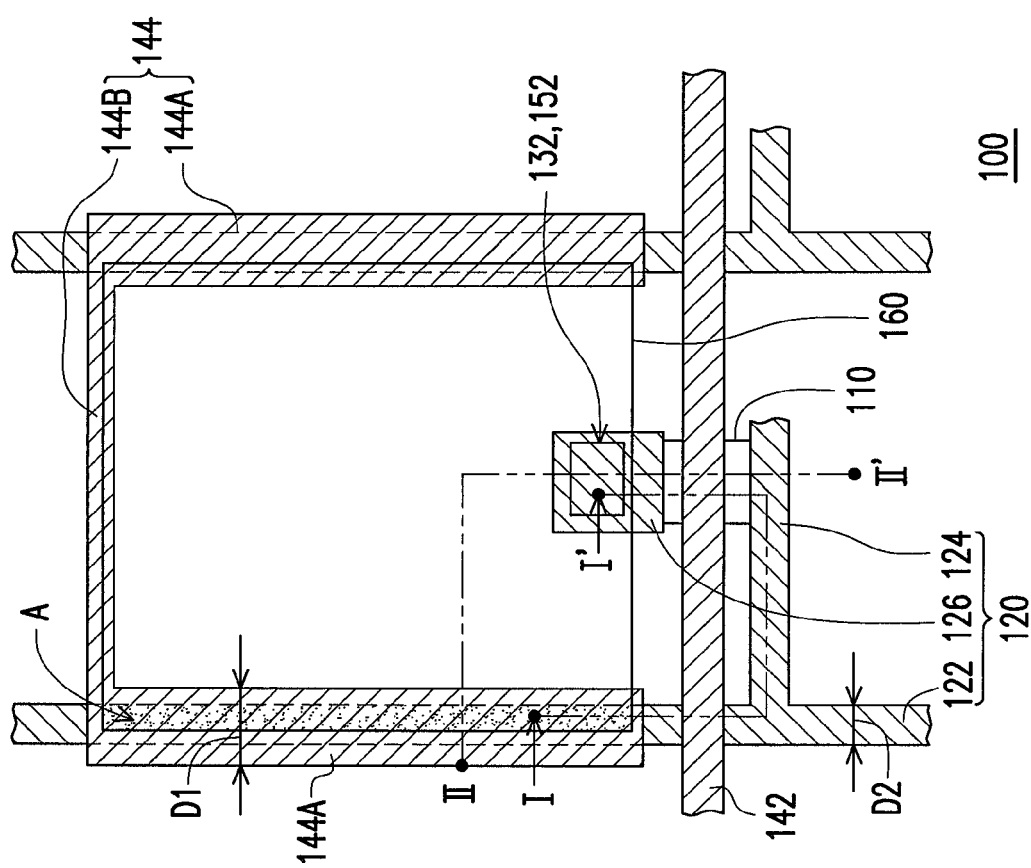
FIG. 5B
FIG. 5C
FIG. 5A

PIXEL STRUCTURE AND FABRICATION METHOD OF PIXEL STRUCTURE

CROSS-REFERENCE TO RELATED APPLICATION

This application claims the priority benefit of Taiwan application serial no. 100141606, filed on Nov. 15, 2011. The entirety of the above-mentioned patent application is hereby incorporated by reference herein and made a part of this specification.

BACKGROUND OF THE INVENTION

1. Field of the Invention

The invention relates to a pixel structure and a fabrication method of the pixel structure. More particularly, the invention relates to both a pixel structure that has a high aperture ratio and can be easily fabricated and a fabrication method of the pixel structure.

2. Description of Related Art

In general, a pixel structure of a liquid crystal display (LCD) includes active devices and pixel electrodes. The active devices serve as switches of LCD display units. To control each pixel structure, a certain pixel is usually selected by a corresponding scan line and a corresponding data line, and display information corresponding to the pixel is displayed through providing an appropriate operating voltage. The pixel structure further includes storage capacitors, such that the pixel structure can be provided with a voltage-retaining function. Namely, the storage capacitors can store the applied operating voltages to stabilize the display image of the pixel structure.

To form the storage capacitors in the pixel structure, capacitor electrodes are often required in the pixel structure. However, in order to increase the capacitance of the storage capacitors, the area occupied by the capacitor electrodes need be expanded. In general, the capacitor electrodes are made of non-transparent conductive materials including metal, and the expansion of area of the capacitor electrodes results in the expansion of the non-transparent area; namely, the aperture ratio of the pixel structure is reduced. Besides, there is no other conductive element between the pixel electrodes and the data lines in the pixel structure, and thus the coupling effects between the pixel electrodes and the data lines pose an impact on the display quality of the pixel structure. Therefore, the pixel electrodes and the data lines must have a certain distance therebetween, which further limits the display aperture ratio. As a result, the existing pixel structures are not apt to be characterized by both the high image quality and the ideal display aperture ratio.

SUMMARY OF THE INVENTION

The invention is directed to a pixel structure having two metal layers, so as to provide sufficient storage capacitance and increase a display aperture ratio.

The invention is further directed to a fabrication method of a pixel structure with use of five photomasks, so as to form the pixel structure with high storage capacitance and high display aperture ratio.

In the invention, a pixel structure disposed on a substrate is provided. The pixel structure includes a channel layer, a first patterned metal layer, a first insulation layer, a second patterned metal layer, a second insulation layer, and a pixel electrode. The channel layer is disposed on the substrate. The first patterned metal layer includes a data line, a source, and a drain. The source is connected to the data line, and the source and the drain are separated from each other and are both in contact with the channel layer. The first insulation layer covers the channel layer and the first patterned metal layer. The second patterned metal layer is disposed on the first insulation layer and includes a scan line and a capacitor electrode. An extension direction of the scan line intersects an extension direction of the data line, and the capacitor electrode has at least one first portion overlapping the data line. The second insulation layer covers the second patterned metal layer and the first insulation layer. The pixel electrode is disposed on the second insulation layer, and the pixel electrode at least overlaps the at least one first portion of the capacitor electrode.

According to an embodiment of the invention, the pixel electrode and the data line are partially overlapped, and the at least one first portion of the capacitor electrode is located between the pixel electrode and the data line.

According to an embodiment of the invention, the data line is sandwiched between the substrate and the first insulation layer.

According to an embodiment of the invention, a material of the channel layer includes a polysilicon semiconductor material or an oxide semiconductor material.

According to an embodiment of the invention, the pixel structure further includes a buffer layer located between the substrate and the channel layer.

According to an embodiment of the invention, the channel layer is located between the first patterned metal layer and the substrate.

According to an embodiment of the invention, the capacitor electrode is a U-shaped pattern surrounding peripheries of the pixel electrode.

According to an embodiment of the invention, a width of the first portion of the capacitor electrode is greater than a line width of the data line.

In this invention, a fabrication method of a pixel structure is also provided. According to the fabrication method, a channel layer is on a substrate. A first patterned metal layer is formed on the substrate. Here, the first patterned metal layer includes a data line, a source, and a drain, the source is connected to the data line, and the source and the drain are separated from each other and are both in contact with the channel layer. A first insulation layer covering the channel layer and the first patterned metal layer is formed. A second patterned metal layer is formed on the first insulation layer. The second patterned metal layer includes a scan line and a capacitor electrode. An extension direction of the scan line intersects an extension direction of the data line, and the capacitor electrode partially overlaps the data line. A second patterned metal layer covering the second patterned metal layer is formed. A first opening is formed on the second insulation layer, and a second opening is formed on the first insulation layer. Here, the first opening communicates with the second opening to expose the drain. A pixel electrode is formed on the second insulation layer, and the pixel electrode is connected to the drain through the second opening and the first opening and overlaps the capacitor electrode.

According to an embodiment of the invention, a material of the channel layer includes a polysilicon semiconductor material or an oxide semiconductor material.

According to an embodiment of the invention, the fabrication method further includes forming a buffer layer on the substrate before forming the channel layer, and the buffer layer is located between the substrate and the channel layer.

Based on the above, in the pixel structure described in the embodiments of the invention, the capacitor electrode is disposed between the data line and the pixel electrode, such that the area occupied by the pixel electrode is expanded, and that the high display aperture ratio can be ensured. Moreover, fabrication of the pixel structure can be completed with mere use of five photomasks; therefore, the pixel structure described in the embodiments of the invention can be easily formed.

In order to make the aforementioned and other features and advantages of the invention more comprehensible, embodiments accompanying figures are described in detail below.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the invention.

FIG. 3A is a schematic top view illustrating a fabrication method of a pixel structure with use of a third photomask according to an embodiment of the invention.

FIG. 3B is a cross-sectional view taken along a section line I-I' depicted in FIG. 3A.

FIG. 3C is a cross-sectional view taken along a section line II-II' depicted in FIG. 3A.

FIG. 5A is a schematic top view illustrating a fabrication method of a pixel structure with use of a fifth photomask according to an embodiment of the invention.

FIG. 5B is a cross-sectional view taken along a section line I-I' depicted in FIG. 5A.

FIG. 5C is a cross-sectional view taken along a section line II-II' depicted in FIG. 5A.

DESCRIPTION OF EMBODIMENTS

Figure 1B:
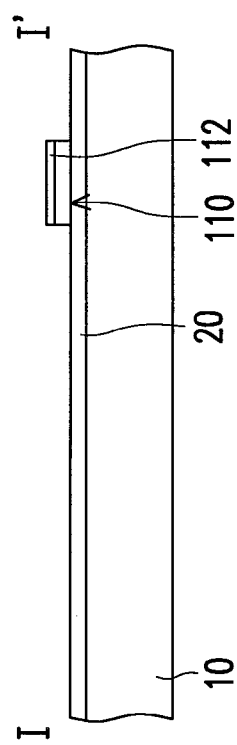
FIG. 1B is a cross-sectional view taken along a section line I-I' depicted in FIG. 1A.
Figure 1C:
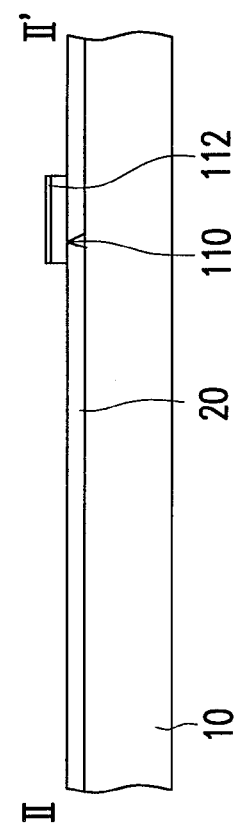
FIG. 1C is a cross-sectional view taken along a section line II-II' depicted in FIG. 1A.
Figure 1A:
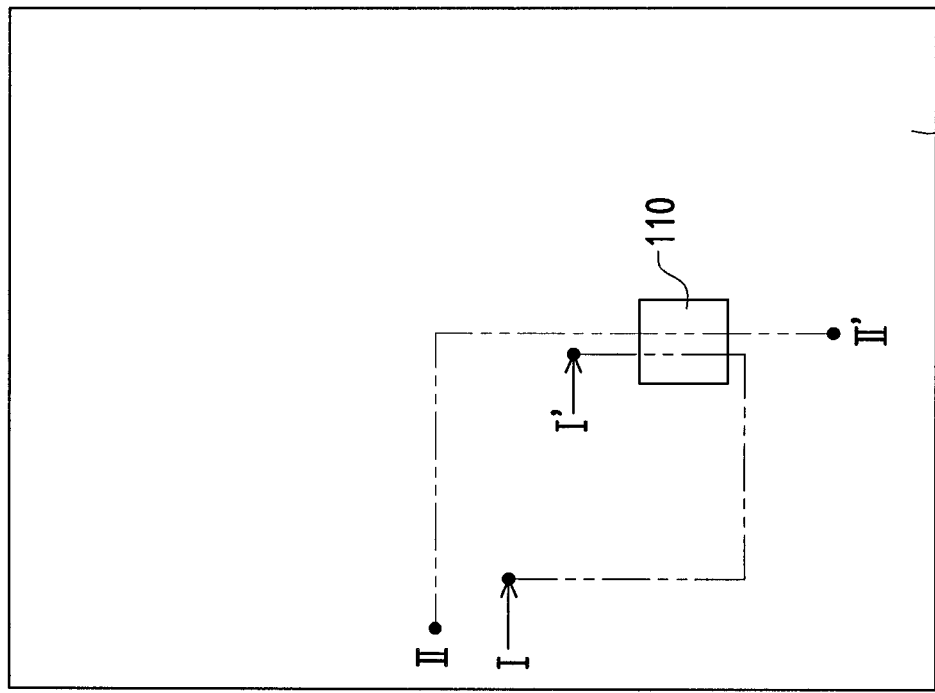
FIG. 1A is a schematic top view illustrating a fabrication method of a pixel structure with use of a first photomask according to an embodiment of the invention.

FIG. 1A is a schematic top view illustrating a fabrication method of a pixel structure with use of a first photomask according to an embodiment of the invention. FIG. 1B and FIG. 1C are respectively cross-sectional views taken along section lines I-I' and II-II' depicted in FIG. 1A. With reference to FIG. 1A, FIG. 1B, and FIG. 1C, in the fabrication method described in the present embodiment, a channel layer 110 is formed on a substrate 10. The channel layer 110 may be formed with use of the first photomask. Namely, in this step, a layer of semiconductor material is formed on the substrate 10 by performing a physical vapor deposition (PVD) process, a chemical vapor deposition (CVD) process, a sputtering process, or the like deposition process. A photolithography and an etching processes are performed with use of a first photomask (not shown), so as to pattern the layer of semiconductor material and to form the channel layer 110.

According to the present embodiment of the invention, a material of the channel layer 110 is, for instance, a polysilicon semiconductor material, and therefore a buffer layer 20 may be formed on the substrate 10 before the channel layer 110 is formed. Besides, in the step of forming the channel layer 110, the channel layer 110 may be provided with a doped semiconductor thin layer 112 by adjusting the conditions of deposition or by performing a subsequent doping process, which is conducive to improvement of quality of the finished device.

However, said fabrication steps and the selection of materials are merely exemplary and should not be construed as a limitation to the invention. According to another embodiment, the channel layer 110 may be made of an oxide semiconductor material, and it is not necessary for the channel layer 110 to be provided with the doped semiconductor thin layer 112. Alternatively, prior to fabrication of the channel layer 110, the buffer layer 20 may not be formed on the substrate 10, which indicates that the channel layer 110 may be directly formed on the substrate 10 in the invention.

Figure 2B:
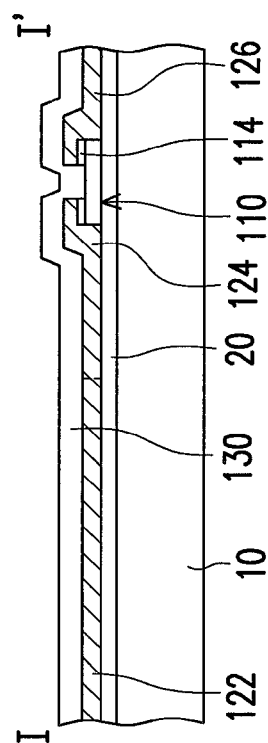
FIG. 2B is a cross-sectional view taken along a section line I-I' depicted in FIG. 2A.
Figure 2C:
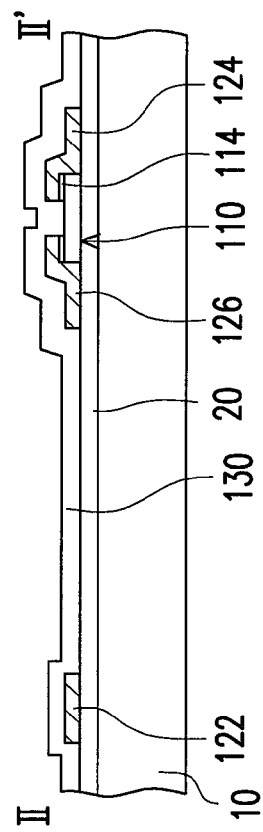
FIG. 2C is a cross-sectional view taken along a section line II-II' depicted in FIG. 2A.
Figure 2A:
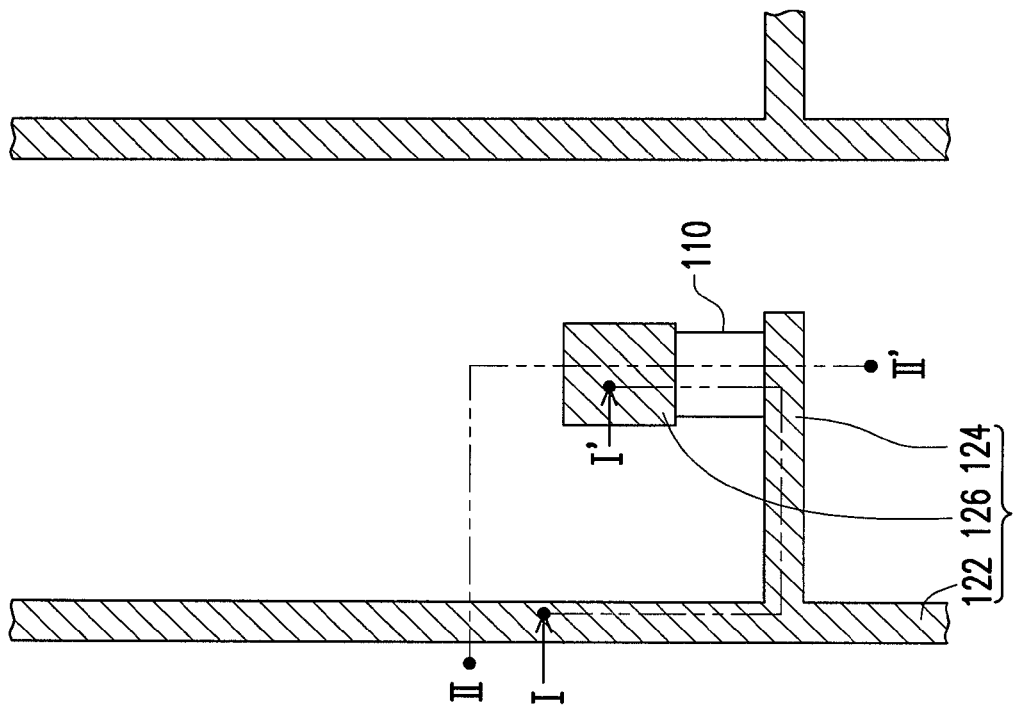
FIG. 2A is a schematic top view illustrating a fabrication method of a pixel structure with use of a second photomask according to an embodiment of the invention.

FIG. 2A is a schematic top view illustrating a fabrication method of a pixel structure with use of a second photomask according to an embodiment of the invention. FIG. 2B and FIG. 2C are respectively cross-sectional views taken along section lines I-I' and II-II' depicted in FIG. 2A. As shown in FIG. 2A, FIG. 2B, and FIG. 2C, after the first photomask is employed, a second photomask may be applied to form a first patterned metal layer 120 on the buffer layer 20 and the channel layer 110. With use of the second photomask, the steps of forming a metal material layer and patterning the metal material layer can be performed, and the steps may include a film-forming process, a photolithography process and an etching process well known to people skilled in the art. Thus, no further description is provided hereinafter. Besides, after the first patterned metal layer 120 is formed, a first insulation layer 130 may be formed on the first patterned metal layer 120, such that the first patterned metal layer 120 is covered by the first insulation layer 130.

In particular, the first patterned metal layer 120 includes a data line 122, a source 124, and a drain 126. The source 124 is connected to the data line 122, and the source 124 and the drain 126 are separated from each other and are both in contact with the channel layer 110. Here, the source 124 is extended from the data line 122, for instance, and thus the source 124 and the data line 122 are integrally formed as shown in FIG. 2B. Note that the step of patterning the metal material layer to form the first patterned metal layer 120 may further include removing a portion of the doped semiconductor thin layer 112 above the channel layer 110, so as to form a patterned doped semiconductor thin layer 114. Thereby, the issue regarding the doped semiconductor material between the source 124 and the drain 126 causing unnecessary electrical communication between the source 124 and the drain 126 will not exist.

When the channel layer 110 is not provided with the doped semiconductor thin layer 112, it should be mentioned that the step of forming the second patterned metal layer 120 may not include further patterning or thinning out the channel layer 110. That is to say, the patterned doped semiconductor thin layer 114 described in the present embodiment is merely exemplary and should by no means limit the scope of the invention. Besides, the channel layer 110 is located between the substrate 10 and the first patterned metal layer 120 in this embodiment, while the order of forming the channel layer 110 first and then the first patterned metal layer 120 may be exchanged in another embodiment, such that the source 124 and the drain 126 of the first patterned metal layer 120 are located between the channel layer 110 and the substrate 10.

FIG. 3A is a schematic top view illustrating a fabrication method of a pixel structure with use of a third photomask according to an embodiment of the invention. FIG. 3B and FIG. 3C are respectively cross-sectional views taken along section lines I-I' and II-II' depicted in FIG. 3A. With reference to FIG. 3A, FIG. 3B, and FIG. 3C, the third photomask is employed to form a second patterned metal layer 140 on the first insulation layer 130 and then a second insulation layer 150 is formed on the second patterned metal layer 140 in this embodiment. The third photomask can be applied to the well-known deposition process as well as the common photolithography and the etching processes, which will not be further described herein.

The second patterned metal layer 140 of the present embodiment includes a scan line 142 and a capacitor electrode 144. An extension direction of the scan line 142 intersects an extension direction of the data line 122, and the capacitor electrode 144 partially overlaps the data line 122. Particularly, the capacitor electrode 144 of the present embodiment has a plurality of first portions 144A and a second portion 144B connected to the first portions 144A, so as to form a U-shaped pattern. Here, extension directions of the first portions 144A are substantially parallel to the extension direction of the data line 122, and the first portions 144A overlap the data line 122. An extension direction of the second portion 144B is substantially parallel to the extension direction of the scan line 122. Certainly, the capacitor electrode 144 in other embodiments may have a different pattern and will not be limited to that described in the present embodiment and shown in the drawings. For instance, in other embodiments, the capacitor electrode 144 may be shaped as a H-shaped, a Z-shaped, and so forth.

The scan line 142 is partially overlapped with the channel layer 110 and can be defined as a gate 146. Accordingly, the gate 146 is substantially one of the components of the second patterned metal layer 140. According to another embodiment, the scan line 142 can be branched, and the branched portion may serve as the gate 146; therefore, the gate design in the present embodiment is merely exemplary and should by no means limit the scope of the invention. Here, the gate 146, the source 124, the drain 126, and the channel layer 110 between the source 124 and the drain 126 together constitute a thin film transistor (TFT) as an active device for driving a display medium. The TFT of this embodiment has a top-gate design, i.e., the gate 146 of the present embodiment is located at a side (an upper side) of the channel layer 110 away from the substrate 10.

Figure 4B:
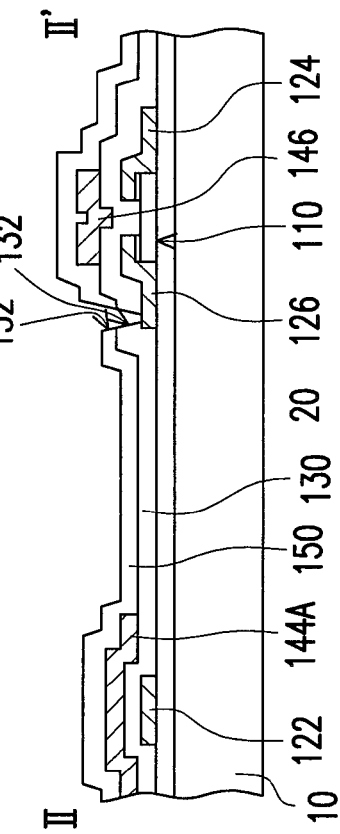
FIG. 4B is a cross-sectional view taken along a section line I-I' depicted in FIG. 4A.
Figure 4C:
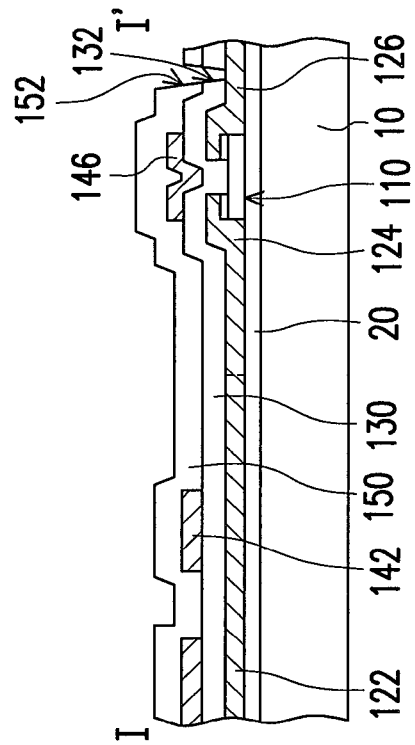
FIG. 4C is a cross-sectional view taken along a section line II-II' depicted in FIG. 4A.
Figure 4A:
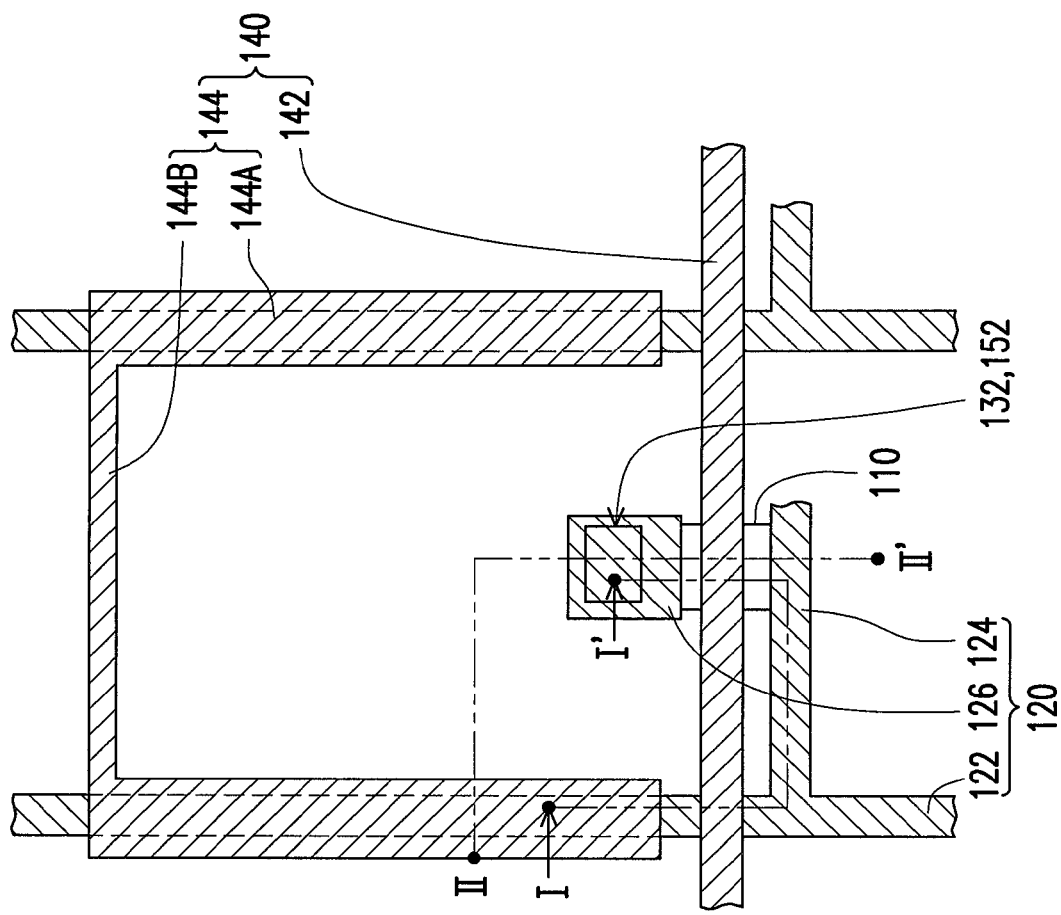
FIG. 4A is a schematic top view illustrating a fabrication method of a pixel structure with use of a fourth photomask according to an embodiment of the invention.

FIG. 4A is a schematic top view illustrating a fabrication method of a pixel structure with use of a fourth photomask according to an embodiment of the invention. FIG. 4B and FIG. 4C are respectively cross-sectional views taken along section lines I-I' and II-II' depicted in FIG. 4A. With reference to FIG. 4A, FIG. 4B, and FIG. 4C, after the second insulation layer 150 is formed, a fourth photomask may be employed, so as to form an opening 132 in the first insulation layer 130 and an opening 152 in the second insulation layer 150. The openings 132 and 152 are formed with use of the same photomask, and thus the two openings 132 and 152 communicate with each other and expose the drain 126. That is to say, even though the openings 132 and 152 are not located in the same film layer, these openings 132 and 152 together form a contact opening.

FIG. 5A is a schematic top view illustrating a fabrication method of a pixel structure with use of a fifth photomask according to an embodiment of the invention. FIG. 5B and FIG. 5C are respectively cross-sectional views taken along section lines I-I' and II-II' depicted in FIG. 5A. With reference to FIG. 5A, FIG. 5B, and FIG. 5C, according to the present embodiment, a pixel electrode 160 is formed on the second insulation layer 150 after the fabrication steps shown in FIG. 4A to FIG. 4C are implemented, such that the pixel electrode 160 is electrically connected to the drain 126 through the contact opening containing the openings 132 and 152. Thereby, fabrication of the pixel structure 100 is completed.

The pixel structure 100 is overall configured on the substrate 10. Here, the pixel structure 100 includes the channel layer 110, the first patterned metal layer 120 (shown in FIG. 2A to FIG. 2C), the first insulation layer 130, the second patterned metal layer 140 (shown in FIG. 3A to FIG. 3C), the second insulation layer 150, and the pixel electrode 160. The channel layer 110 is disposed on the substrate 10. The first patterned metal layer 120 includes the data line 122, the source 124, and the drain 126. The source 124 is connected to the data line 122, and the source 124 and the drain 126 are separated from each other and are both in contact with the channel layer 110. The first insulation layer 130 covers the channel layer 110 and the first patterned metal layer 120. Besides, the first insulation layer 130 has an opening 132 exposing the drain 126. The second patterned metal layer 140 is disposed on the first insulation layer 130 and includes a scan line 142 and a capacitor electrode 144. An extension direction of the scan line 142 intersects an extension direction of the data line 122, and the capacitor electrode 144 at least partially overlaps the data line 122. The second insulation layer 150 covers the second patterned metal layer 140 and has an opening 152 communicating with the opening 132 to expose the drain 126. The pixel electrode 160 is disposed on the second insulation layer 150 and connected to the drain 126 through the opening 152 and the opening 132, and the pixel electrode 160 at least overlaps the first portions 144A of the capacitor electrode 144. The U-shaped pattern constituted by the capacitor electrode 144 may surround the peripheries of the pixel electrode 160.

In the present embodiment, the capacitor electrode 144 is located between the pixel electrode 160 and the data line 122, and therefore the effect of coupling between the pixel electrode 160 and the data line 122 is shielded by the first portions 144A of the capacitor electrode 144. When the pattern of the pixel electrode 160 is designed, it is not necessary to leave a distance between the pixel electrode 160 and the data line 122 for fear of any negative impact caused by the coupling effect between the pixel electrode 160 and the data line 122. Therefore, the area of the pixel electrode 160 and the area of the data line 122 may be overlapped with each other in this embodiment, so as to define an overlapping area A (shown by dots in FIG. 5A) on the substrate 10. A width D1 of each first portion 144A may be equal to or greater than a line width D2 of the data line 122, such that the first portion 144A of the capacitor electrode 144 can at least cover the overlapping area A for shielding the coupling effect between the pixel electrode 160 and the data line 122. Thereby, not only the area of the pixel electrode 160 can be expanded, but also favorable display quality of the pixel structure 100 can be guaranteed. In other words, based on the design described in the present embodiment, the display aperture ratio of the pixel structure 100 can be effectively increased without sacrificing the display quality.

From another perspective, only one insulation layer (i.e., the second insulation layer 150) exists between the capacitor electrode 144 and the pixel electrode 160; accordingly, the storage capacitor constituted by the capacitor electrode 144 and the pixel electrode 160 may have a large capacitance. It indicates that the pixel structure 100 has sufficient storage capacitance to maintain high display quality. In this embodiment, note that the data line 122 is a component made of the first patterned metal layer 120 and is entirely located between the first insulation layer 130 and the substrate 10. Hence, the data line 122 can be characterized by satisfactory transmission quality and is not apt to be broken. As a whole, five photomasks can be used to form the pixel structure 100 with high aperture ratio and large storage capacitance as described in the embodiments.

To sum up, in the pixel structure described in the embodiments of the invention, the source, the drain, and the data line are constituted by the first patterned metal layer; the gate and the capacitor electrode are constituted by the second patterned metal layer; the first patterned metal layer is located between the second patterned metal layer and the substrate. Therefore, the capacitor electrode can be substantially located between the pixel electrode and the data line, so as to shield the coupling effect between the pixel electrode and the data line. The area of the pixel electrode can thereby be expanded. What is more, the area of the pixel electrode may even overlap the area of the data line, so as to raise the display aperture ratio. From another aspect, the distance between the capacitor electrode and the pixel electrode is the thickness of one insulation layer, thus increasing the capacitance of the storage capacitor and stabilizing the image display. As a whole, the pixel structure with satisfactory display quality and display aperture ratio can be formed with mere use of five photomasks according to the invention.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A pixel structure disposed on a substrate and comprising:
   a channel layer formed on the substrate;
   a first patterned metal layer comprising a data line, a source, and a drain, the source being connected to the data line, the source and the drain being separated from each other and being both in contact with the channel layer;
   a first insulation layer covering the channel layer and the first patterned metal layer;
   a second patterned metal layer disposed on the first insulation layer and comprising a scan line and a capacitor electrode, an extension direction of the scan line intersecting an extension direction of the data line, the capacitor electrode having at least one first portion overlapping the data line;
   a second insulation layer covering the second patterned metal layer and the first insulation layer; and
   a pixel electrode disposed on the second insulation layer and connected to the drain, and the pixel electrode at least overlapping the at least one first portion of the capacitor electrode.

2. The pixel structure as recited in claim 1, wherein the pixel electrode and the data line are partially overlapped and the at least one first portion of the capacitor electrode is located between the pixel electrode and the data line.

3. The pixel structure as recited in claim 1, wherein the data line is sandwiched between the substrate and the first insulation layer.

4. The pixel structure as recited in claim 1, wherein a material of the channel layer comprises a polysilicon semiconductor material or an oxide semiconductor material.

5. The pixel structure as recited in claim 1, further comprising a buffer layer located between the substrate and the channel layer.

6. The pixel structure as recited in claim 1, wherein the channel layer is located between the first patterned metal layer and the substrate.

7. The pixel structure as recited in claim 1, wherein the channel layer is located at a side of the first patterned metal layer away from the substrate.

8. The pixel structure as recited in claim 1, wherein the capacitor electrode further includes a second portion parallel to the scan line.

9. The pixel structure as recited in claim 8, wherein the capacitor electrode is a U-shaped pattern surrounding peripheries of the pixel electrode.

10. The pixel structure as recited in claim 1, wherein a width of the at least one first portion of the capacitor electrode is greater than a line width of the data line.

11. The pixel structure as recited in claim 1, wherein the scan line comprises a gate located above the channel layer.

12. A fabrication method of a pixel structure, comprising:
    forming a channel layer on a substrate;
    forming a first patterned metal layer on the substrate, wherein the first patterned metal layer comprises a data line, a source, and a drain, the source is connected to the data line, and the source and the drain are separated from each other and are both in contact with the channel layer;
    forming a first insulation layer covering the channel layer and the first patterned metal layer;
    forming a second patterned metal layer on the first insulation layer, the second patterned metal layer comprising a scan line and a capacitor electrode, an extension direction of the scan line intersecting an extension direction of the data line, the capacitor electrode partially overlapping the data line;
    forming a second insulation layer covering the second patterned metal layer and the first insulation layer;
    forming an opening in the first insulation layer and the second insulation layer to expose the drain; and
    forming a pixel electrode on the second insulation layer, the pixel electrode being connected to the drain through the opening and partially overlapping the capacitor electrode.

13. The fabrication method as recited in claim 12, wherein a material of the channel layer comprises a polysilicon semiconductor material or an oxide semiconductor material.

14. The fabrication method as recited in claim 12, further comprising forming a buffer layer on the substrate before forming the channel layer, wherein the buffer layer is located between the substrate and the channel layer.

15. The fabrication method as recited in claim 12, wherein the pixel electrode is partially overlapped with the data line.

* * * * *